United States Patent
Vogel et al.

(10) Patent No.: US 12,195,878 B2
(45) Date of Patent: *Jan. 14, 2025

(54) SiC CRYSTALS WITH AN OPTIMAL ORIENTATION OF LATTICE PLANES FOR FISSURE REDUCTION AND METHOD OF PRODUCING SAME

(71) Applicant: SiCrystal GmbH, Nuremberg (DE)

(72) Inventors: Michael Vogel, Nuremberg (DE); Erwin Schmitt, Großenseebach (DE); Arnd-Dietrich Weber, Forchheim (DE); Ralph-Uwe Barz, Erlangen (DE); Dominik Bannspach, Erlangen (DE)

(73) Assignee: SiCrystal GMBH, Nuremberg (DE)

( * ) Notice: Subject to any disclaimer, the term of this patent is extended or adjusted under 35 U.S.C. 154(b) by 643 days.

This patent is subject to a terminal disclaimer.

(21) Appl. No.: 17/380,690

(22) Filed: Jul. 20, 2021

(65) Prior Publication Data

US 2022/0025546 A1 Jan. 27, 2022

(30) Foreign Application Priority Data

Jul. 21, 2020 (EP) .................................... 20186878

(51) Int. Cl.
*C30B 33/00* (2006.01)
*C30B 29/36* (2006.01)

(52) U.S. Cl.
CPC .............. *C30B 29/36* (2013.01); *C30B 33/00* (2013.01)

(58) Field of Classification Search
CPC .... C30B 29/36; C30B 33/00; H01L 21/02027
See application file for complete search history.

(56) References Cited

U.S. PATENT DOCUMENTS

| 8,865,324 B2 | 10/2014 | Straubinger et al. |
| 2008/0021353 A1 | 9/2008 | Maruyama et al. |

(Continued)

FOREIGN PATENT DOCUMENTS

| CN | 101536157 A | * | 9/2009 | ............ C30B 29/36 |
| CN | 110067020 A | | 7/2019 | |

(Continued)

OTHER PUBLICATIONS

[NPL-1] Tamura (JP 2013-049609 A), Mar. 14, 2013 (EPO machine translation to English). (Year: 2013).*

(Continued)

*Primary Examiner* — Maria V Ewald
*Assistant Examiner* — Donald M Flores, Jr.
(74) *Attorney, Agent, or Firm* — Michael Best & Friedrich LLP

(57) ABSTRACT

The present invention provides monocrystalline 4H—SiC semi-finished products having a specific orientation of its crystal structure which is set such as to reduce or even eliminate the occurrence of cracks or fissures during mechanical processing, and method of producing same. The monocrystalline 4H—SiC semi-finished product, which has a longitudinal axis and an at least partially curved lateral surface parallel to said longitudinal axis, is characterized in that the crystal structure of the 4H—SiC semi-finished product is oriented with respect to the longitudinal axis such that at each position on the lateral surface of the semi-finished product there is a line segment which is intersected by at least a predetermined minimum number of parallel cleavage planes of the $\{10\bar{1}0\}$ form per unit length, wherein the line segment is defined by a plane tangent to the lateral surface at said position.

14 Claims, 9 Drawing Sheets

(56) References Cited

U.S. PATENT DOCUMENTS

| | | | |
|---|---|---|---|
| 2008/0213536 A1 | 9/2008 | Maruyama et al. | |
| 2011/0086213 A1 | 4/2011 | Straubinger et al. | |
| 2011/0210342 A1* | 9/2011 | Sasaki | H01L 29/045 83/13 |
| 2012/0070605 A1 | 3/2012 | Sasaki et al. | |
| 2016/0118257 A1 | 4/2016 | Kaneko et al. | |
| 2016/0326668 A1 | 11/2016 | Nishiguchi et al. | |
| 2017/0275779 A1 | 9/2017 | Nishiguchi et al. | |
| 2019/0348272 A1* | 11/2019 | Ecker | H01L 21/02027 |
| 2021/0060818 A1 | 3/2021 | Matsumoto et al. | |
| 2022/0025545 A1* | 1/2022 | Vogel | C30B 33/00 |

FOREIGN PATENT DOCUMENTS

| | | | |
|---|---|---|---|
| JP | 2008098412 A | | 4/2008 |
| JP | 2011119412 A | | 6/2011 |
| JP | 2013049609 A | * | 3/2013 |
| JP | 2015002218 A | | 1/2015 |
| JP | 2017152423 A | | 8/2017 |
| WO | 2004/010075 A1 | | 1/2004 |
| WO | 2006022282 A1 | | 3/2006 |
| WO | 2014034080 A1 | | 3/2014 |
| WO | 2016017502 A1 | | 2/2016 |

OTHER PUBLICATIONS

[NPL-2] Kimoto et al. (CN 101536157 A); Sep. 16, 2009 (EPO machine translation to English). (Year: 2009).*
European Patent Office Action for Application No. 20186878.3 dated Apr. 19, 2023 (4 pages).
European Patent Office Extended Search Report for Application No. 20186878.3 dated Nov. 27, 2020 (33 pages).
Japanese Patent Office Action for Related Application No. 2021115639 dated Dec. 12, 2022 (12 pages, including an English translation).

* cited by examiner

SiC CRYSTALS WITH AN OPTIMAL ORIENTATION OF LATTICE PLANES FOR FISSURE REDUCTION AND METHOD OF PRODUCING SAME

This application claims priority to European Patent Application No. 20186878.3, filed Jul. 21, 2020, the content of which is incorporated herein by reference in its entirety.

TECHNICAL FIELD OF THE INVENTION

The present invention relates to bulk SiC single crystals having a specific orientation of its crystal structure for reducing or eliminating the occurrence of cracks or fissures during mechanical processing, and method of producing the monocrystalline SiC semi-finished products with such orientation.

BACKGROUND OF THE INVENTION

Silicon carbide (SiC) substrates are commonly used in the production of electronic components for a wide range of applications, such as power electronics, radio frequency and optoelectronic applications. These are generally produced from bulk SiC monocrystals, which may be grown using a standard method, such as physical vapor deposition (PVT), and a suitable source material. The SiC substrates are then produced from the grown crystals by cutting wafers with the use of wire saws and then refining the wafer surfaces in multi-stage polishing steps. In the following epitaxy processes, thin single-crystalline layers of semiconductors materials (for e.g. SiC, GaN) are then deposited onto the SiC substrates. The properties of these epitaxial layers, and of the components made therefrom, depend crucially on the quality of the underlying SiC substrate.

A standard method for producing SiC crystals by physical vapor deposition is described in U.S. Pat. No. 8,865,324 B2. The bulk SiC crystals produced with this method are then oriented in such a way by using for e.g. X-rays radiation, that the crystal structure has the orientation required for further mechanical processing. As an example, through various surface processing steps of the bulk SiC crystal, for e.g. by grinding, the desired substrate diameter is then set on the monocrystalline SiC semi-finished product, one or more orientation flats (OF) are grinded to its lateral surface, and the front faces of the so processed crystal cylinder are prepared for the wafer separation process, for e.g. by wire sawing. As illustrated in FIG. 1, the SiC semi-finished product 100 resulting from such mechanical processing of the bulk SiC crystal is an oriented cylinder having a diameter equal to the diameter of the future substrate wafers, with one or two orientation flats 110 (or a notch) defined on the lateral cylindrical surface 130 and having parallel, flat front faces 120a, 120b.

The SiC semi-finished product 100 is then divided into individual raw, monocrystalline SiC substrates, for e.g. using a wire-sawing process. After quality control, the monocrystalline SiC substrates undergo further mechanical processing. As an example, the following process sequence may be used. After mechanical processing of the edges, single-stage or multi-stage grinding or polishing processes are performed to remove the disruptive layer(s) created during the substrate separation process and to gradually reduce the substrate roughness. A chemo-mechanical polishing process (CMP) is then applied on one or both sides of the substrate for finalizing the respective surface(s).

SiC single-crystals and substrates made therefrom are known to exhibit high brittleness (or low ductility, respectively). During the multi-stage mechanical processing of the bulk SiC crystals as well as of the SiC substrates described above, these are subjected to significant mechanical forces. In particular, fissures or cracks can be easily formed along preferred crystal cleavage planes, such as of the forms $\{10\overline{1}0\}$ and $\{11\overline{2}0\}$ as an example for 4H—SiC, and lead to damage or destruction of the SiC semi-finished cylinder and/or substrates. Especially, in mechanical processes in which mechanical forces are applied radially (i.e. perpendicular to the outer diameter), the increased probability of cracking along the cleavage planes leads to fissures in the crystals as well as in the substrates, and consequently, to an undesirable reduction in yield.

In the mechanical processing of the monocrystalline SiC semi-finished cylinder, the setting of the outer diameter by grinding is the most critical process step, since a large amount of the force exerted by the grinding tool, for e.g. a grinding wheel, is applied perpendicularly to the cylinder outer diameter.

In the mechanical processing of monocrystalline SiC substrates, both steps of machining the substrate edges as well as of polishing are critical. For instance, when chamfering the substrate edges, a radial force is applied onto the substrate outer diameter with a cup grinding wheel. During polishing, in which the substrates are guided in rotor disks, a radial force is likewise exerted by these rotor disks onto the outer diameter of the substrates.

Consequently, special attention has to be given to the high brittleness of the SiC materials in combination with the presence of the cleavage lattice planes during the mechanical processing of the respective bulk crystals and substrates.

So far, the existing prior art did not address the anisotropy of the mechanical properties of the SiC crystal lattice, which is why, in practice, it has been generally accepted that there is always a certain amount of waste of bulk crystals or substrates caused by the occurrence of cracks during mechanical processing. However, these have a negative impact in the yield of the overall process chain.

During mechanical processing of the outer perimeter of a SiC semi-finished cylinder, it is possible to reduce the occurrence of cracks or fissures within certain limits, but not completely eliminate them, by adjusting the parameters of the mechanical process step itself, such as the applied force or grinding speed. However, this has a negative effect on other process parameters, such as an increase in the process duration and costs. Fractures or cracks during mechanical processing of the raw SiC substrate obtained after wire-sawing the SiC semi-finished cylinder (for e.g. during edge chamfering, mechanical grinding, mechanical or chemo-mechanical polishing, etc.) may also be reduced by adjusting the process parameters, but not fully avoided. Such adjustments also have an adverse effect on other process parameters, such as a significant increase in the duration of the substrate mechanical processing.

Some solutions have been attempted to reduce the amount of defective SiC semi-finished cylinders and substrates.

For instance, patent specification DE102009048868 describes a method for thermal post-treatment of SiC crystals which allows to reduce stresses in crystals, and therefore, also reduce the susceptibility to cracking of SiC crystals.

Patent CN110067020A describes a process which reduces the inherent stresses in the crystals already during production, which in turn should reduce the crystal susceptibility to cracking.

However, none of these prior art methods takes into account the special requirements, with regard to crystallographic orientation, that are posed on the processing of single-crystal SiC semi-finished products or substrates due to the anisotropy of their mechanical properties. Furthermore, the influence of crystallographic orientation on the susceptibility to cracking of SiC semi-finished products and/or SiC substrates is not taken into account by these prior art methods. Both methods describe a reduction of inner stresses and thus, a general decrease of fissures due to reduced crystal stresses.

However, a solution for reducing the occurrence of fissures, which depending on the applied mechanical forces may even appear on low stress or stress-free SiC semi-finished products or SiC substrates, during mechanical processing, is not disclosed.

Therefore, there is a need for solutions that allow to efficiently reduce the amount of defective SiC semi-finished products and/or respective SiC substrates, caused by the occurrence of fissures during their mechanical processing, without significantly increasing costs and time of the overall mechanical processing, while improving quality and yield of the SiC semi-finished products and respective SiC substrates.

SUMMARY OF THE INVENTION

The present invention has been made in view of the shortcomings and disadvantages of the prior art, and an object thereof is to provide a monocrystalline 4H—SiC semi-finished product having improved mechanical robustness to forces applied during mechanical processing of the external surfaces of 4H—SiC monocrystal, and a method of producing such monocrystalline 4H—SiC semi-finished product.

This object is solved by the subject matter of the independent claims. Advantageous embodiments of the present invention are subject matter of the dependent claims.

A monocrystalline 4H—SiC semi-finished product of improved mechanical robustness against cleavage is provided, the 4H—SiC semi-finished product having a longitudinal axis and a at least partially curved lateral surface parallel to said longitudinal axis, characterized in that the crystal structure of the 4H—SiC semi-finished product is oriented with respect to the longitudinal axis such that at each position on the lateral surface of the semi-finished product there is a line segment which is intersected by at least a predetermined minimum number of parallel cleavage planes of the $\{10\bar{1}0\}$ form per unit length, wherein said line segment is defined by a tangent plane to the lateral surface at said position.

According to a further development, the predetermined minimum number of parallel cleavage planes of the $\{10\bar{1}0\}$ form per unit length is at least 1000 planes per millimeter, and/or the longitudinal axis is an axis of symmetry of a cylinder defined by a curved part of the at least partially curved lateral surface of the 4H—SiC semi-finished product.

According to a further development, a principal axis of the basal plane of the 4H—SiC crystal structure is tilted in the [$\bar{1}\bar{1}20$] direction in relation to the longitudinal axis; and/or a principal axis of the basal plane of the 4H—SiC crystal structure is tilted in the [$1\bar{1}00$] direction by a second tilt angle in relation to the longitudinal axis, and/or the first tilt angle is 4°, with a tolerance of ±0.5°; and/or wherein said second tilt angle is estimated based on a distance between said parallel cleavage planes of the $\{10\bar{1}0\}$ form such as to yield said at least predetermined minimum number of parallel cleavage planes of the $\{10\bar{1}0\}$ form per unit length that intersect the line segment, and/or the second tilt angle is a value selected from the interval [0.015°; 0.153°], or is preferably 0.023°.

According to a further development, the monocrystalline 4H—SiC semi-finished product further comprises first and second front faces; wherein one or both of the first and second front faces are perpendicular to the longitudinal axis; or wherein the first front face is perpendicular to the longitudinal axis and the second front face is oriented in such a way that measurements along the [$1\bar{1}00$] direction yield a total thickness variation between 40 μm and the 340 μm of said second front face with respect to the first front face.

In a further development, said at least partially curved lateral surface has a curved part that defines a cylindrical surface with said longitudinal axis has its symmetry axis, wherein said cylindrical surface has an outer diameter that substantially corresponds to a given diameter of substrate wafers obtainable by slicing the 4H—SiC semi-finished product, and/or said cylindrical surface has an outer diameter of 150.0 mm±0.5 mm, or 200.0 mm±0.5 mm; and/or the monocrystalline 4H—SiC semi-finished product has a height larger than 20 mm, or preferably larger than 15 mm, and/or the monocrystalline 4H—SiC semi-finished product has an nitrogen doping larger than $1\times10^{18}$ cm$^{-3}$, and/or the monocrystalline 4H—SiC semi-finished product has an orientation flat with a length of 47.5 mm±1.0 mm or a notch.

The present invention also provides a method of producing a monocrystalline 4H—SiC semi-finished product with improved mechanical robustness against cleavage, the monocrystalline 4H—SiC semi-finished product having a longitudinal axis and a at least partially curved lateral surface that is parallel to said longitudinal axis, the method comprising: performing a process of setting a predetermined orientation of the 4H—SiC crystal structure with respect to said longitudinal axis such that at each position on the lateral surface of the 4H—SiC semi-finished product there is a line segment which is intersected by at least a predetermined minimum number of parallel cleavage planes of the 55 10$\bar{1}$0} form per unit length, wherein said line segment is defined by a tangent plane to the lateral surface at said position.

In a further development, the predetermined orientation of the 4H—SiC crystal structure is such that said predetermined minimum number of parallel cleavage planes of the $\{10\bar{1}0\}$ form per unit length is at least 1000 planes per millimeter.

In a further development, the method further comprises estimating said predetermined orientation such as to yield the at least predetermined minimum number of parallel cleavage planes of the 55 10$\bar{1}$0} form per unit length that intersect the line segment.

According to a further development, the process of setting said predetermined orientation of the 4H—SiC crystal structure with respect to said longitudinal axis of the 4H—SiC semi-finished product includes; spatially orienting the 4H—SiC monocrystal with respect to an alignment axis such that the orientation of the 4H—SiC crystal structure is set to a predetermined tilting, in direction and amount, of the [0001]-axis of the 4H—SiC crystal structure in relation to said alignment axis machining an external surface of the spatially oriented 4H—SiC monocrystal with reference to said alignment axis to form at least one of: a at least partially curved lateral surface that is substantially parallel to said alignment axis, and at least one front face surface that is substantially orthogonal to alignment axis; wherein the longitudinal axis of the 4H—SiC semi-finished product corresponds to the alignment axis of the spatially oriented 4H—SiC monocrystal.

In a further development, the process of setting a predetermined orientation of the 4H—SiC crystal structure includes: orienting the basal plane of the 4H—SiC crystal structure with a initial orientation; tilting the basal plane from the initial orientation to a first orientation by a first tilt angle in the [$\overline{11}20$] direction of the 4H—SiC crystal structure; and tilting the basal plane from the first orientation to a second orientation by a second tilt angle in either the [1$\overline{1}00$] direction or the [$\overline{1}100$] direction of the 4H—SiC crystal structure; wherein in said initial orientation the basal plane is substantially perpendicular to the longitudinal axis of the final oriented 4H—SiC semi-finished product.

In a further development, the first tilt angle is 4°, with a tolerance of ±0.5°; and/or wherein said second tilt angle is estimated based on a distance between said parallel cleavage planes of the $\{10\overline{1}0\}$ form such as to yield said at least predetermined minimum number of parallel cleavage planes of the $\{10\overline{1}0\}$ form per unit length that intersect the line segment, and/or the second tilt angle is a value selected from the interval [0.015°; 0.153°], or preferably 0.023°.

According to a further development, the process of setting the predetermined orientation of the 4H—SiC crystal structure includes: orienting the basal plane of the 4H—SiC crystal structure with an initial orientation; rotating the basal plane about said initial direction by a predetermined rotation angle in a clockwise direction; tilting the rotated basal plane by a third tilt angle in the [$\overline{11}20$] direction of the 4H—SiC crystal structure; and wherein in said initial orientation the basal plane is substantially perpendicular to the longitudinal axis of the final oriented 4H—SiC semi-finished product.

In a further development, the process of setting the predetermined orientation of the 4H—SiC crystal structure includes: orienting the basal plane of the 4H—SiC crystal structure with an initial orientation; rotating the basal plane about said initial direction by a predetermined rotation angle in a counter-clockwise direction; tilting the rotated basal plane by a third tilt angle in the [$\overline{11}20$] direction of the 4H—SiC crystal structure; and wherein in said initial orientation the basal plane is substantially perpendicular to the longitudinal axis of the final oriented 4H—SiC semi-finished product.

According to a further development, the predetermined rotation angle is 0.33° or a value within the range [0.22°, 2.19°]; and/or the third tilt angle is 4°, with a tolerance of ±0.5°.

According to a further development, the process of setting the predetermined orientation of the 4H—SiC crystal structure is performed on a raw 4H—SiC monocrystal and includes performing angle measurements of the 4H—SiC crystal structure to determine the orientation of the principal axis of the basal plane, and wherein the 4H—SiC semi-finished product is obtained, after the process of setting is completed on the raw 4H—SiC monocrystal, by performing the following steps: machining at least one front face surface along said initial direction, and machining the at least partially curved surface in a direction transverse to said initial direction.

The accompanying drawings are incorporated into and form a part of the specification for the purpose of explaining the principles of the invention. The drawings are not to be construed as limiting the invention to only the illustrated and described examples of how the invention can be made and used.

BRIEF DESCRIPTION OF THE FIGURES

Further features and advantages will become apparent from the following and more detailed description of the invention as illustrated in the accompanying drawings, in which.

Figure 1:
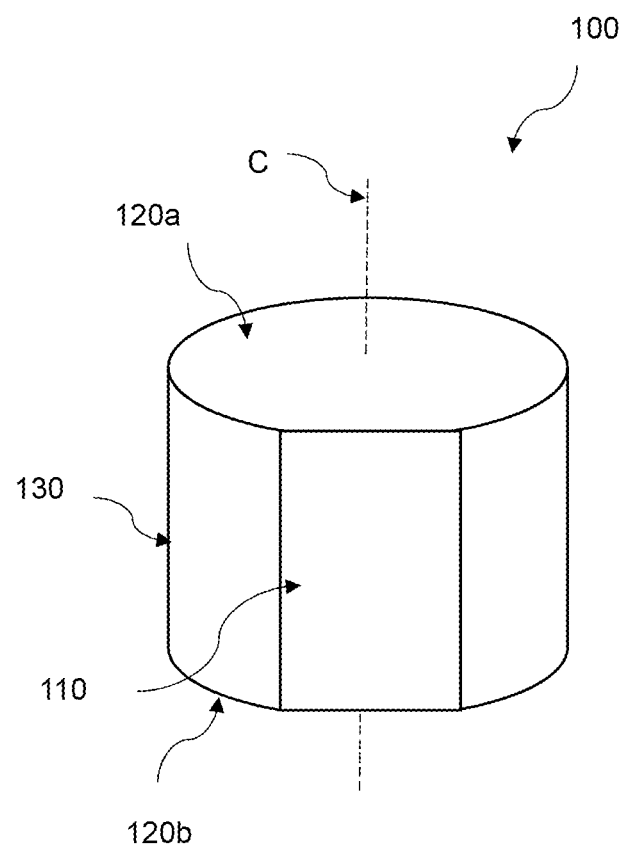
FIG. 1 is a schematic perspective view of single-crystalline SiC semi-finished product.

It is noted that since atomic scales will be being discussed in the present application, the dimensions and relative angles shown in the drawings are only intended for the purpose of understanding and are not drawn to scale.

DETAILED DESCRIPTION OF THE INVENTION

The present invention will now be more fully described hereinafter with reference to the accompanying drawings, in which exemplary embodiments of the invention are shown. The present invention may, however, be embodied in many different forms and should not be construed as limited to the embodiments set forth herein. Rather, these embodiments are provided so that the disclosure will be thorough and complete, and will fully convey the scope of the invention to those skilled in the art. Like numbers refer to like elements throughout.

A principle underlying the present invention follows from the inventors having recognized that the occurrence of cracks or fissures in SiC crystals and substrates during the respective mechanical processes can be significantly reduced or even eliminated by setting a given orientation of the crystal structure with respect to external reference surfaces of the SiC crystals and/or SiC substrates (e.g. frontal faces and/or lateral surface) which improves their mechanical robustness without affecting the quality of the epitaxial layers to be grown on the monocrystalline SiC substrates.

Thus, the present invention provides an optimal orientation of the lattice planes for SiC crystals and substrates, which ensure a higher mechanical robustness and an increase of yield in the mechanical processing.

In SiC crystals, fissures or cracks can be easily formed along preferred cleavage planes, such as the lattice planes of the forms {10$\bar{1}$0} and {11$\bar{2}$0} for 4H—SiC monocrystals, and consequently, lead to damage or destruction of the monocrystalline SiC semi-finished and end products. In particular, in processes where the mechanical force is applied radially (i.e. perpendicularly to the lateral surface of the SiC crystal cylinder), the higher susceptibility to cracking along the cleavage planes leads to cracks in the SiC crystals and substrates and thus, to the undesirable reduction of the respective yields.

Figure 2:
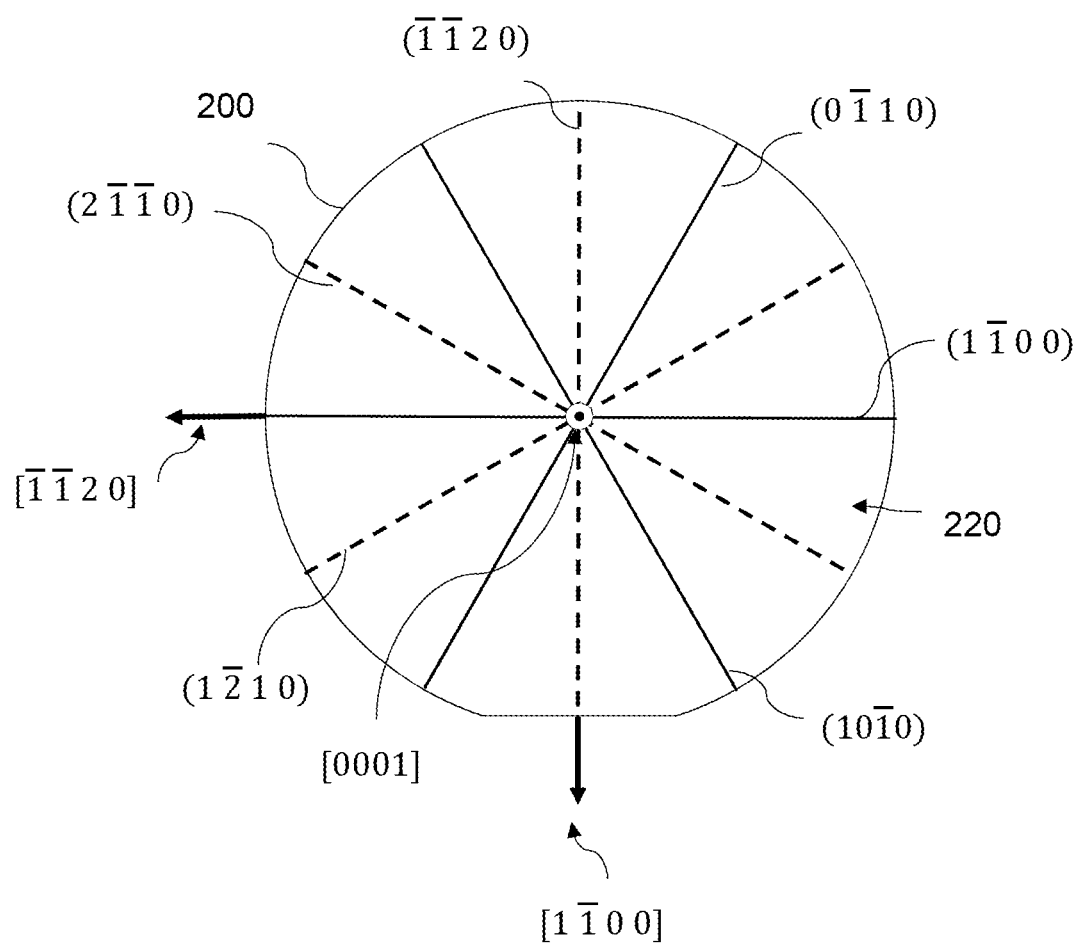
FIG. 2 is a schematic view of a conventional 4H—SiC semi-finished product or substrate (viewed from a top, front face) with an on-axis orientation, in which the basal plane (0001) is parallel to the front face and the crystal direction [0001] inclined by 0° with respect to the cylinder symmetry axis C; two sets of cleavage planes of the forms $\{10\overline{1}0\}$ and $\{11\overline{2}0\}$ are depicted, the form $\{10\overline{1}0\}$ including the ($10\overline{1}0$), ($1\overline{1}00$) and ($0\overline{1}10$) lattice planes and the form $\{11\overline{2}0\}$ including the ($2\overline{11}0$), ($1\overline{2}10$) and ($\overline{11}20$) lattice planes.

For instance, FIG. 2 depicts the orientation of the cleavage planes of the forms 55 10$\bar{1}$0} and {11$\bar{2}$0} for a polar 4H—SiC semi-finished product 200 (or 4H—SiC substrate) with an on-axis crystallographic orientation. In the on-axis orientation depicted in FIG. 2, the basal plane (0001) of the 4H—SiC crystal structure is parallel to one of the cylinder front faces 220, and consequently, the [0001] crystallographic direction makes a 0° angle with the longitudinal axis C of the 4H—SiC cylinder 200. The longitudinal axis C referred hereinafter is defined as a symmetry axis of the cylindrical surface defined by the curved lateral surface of the 4H—SiC semi-finished product or of a 4H—SiC substrate. FIG. 2 shows the Si side (0001) of the polar 4H—SiC semi-finished product or substrate, when viewed from the respective front face 220, such as the front face 120a in FIG. 1. The primary orientation flat (OF) is defined in the crystallographic direction [1$\bar{1}$00]. A secondary flat may be optionally provided in the crystallographic direction 8 11$\bar{2}$0]. Instead of the primary flat OF, a notch (i.e. a lateral indentation in the substrate wafer for precise positioning on semiconductors production plants) may be provided in the 8 1$\bar{1}$00] direction. In addition, two forms of cleavage planes are depicted in FIG. 2, which shows three symmetrically equivalent lattice planes of the form {10$\bar{1}$0} and three symmetrically equivalent lattices planes of the form {11$\bar{2}$0}. The form {10$\bar{1}$0} designates the set of lattice planes that can be obtained from the (10$\bar{1}$0) plane by a symmetry operation, describing the ideal crystal structure of SiC (point group 6 nn) and thus, includes the planes (10$\bar{1}$0), (1$\bar{1}$00) and (0$\bar{1}$10). The crystallographic planes (2$\bar{1}\bar{1}$0), (1$\bar{2}$10) and ($\bar{1}\bar{1}$20) are included in the form {11$\bar{2}$0}, which designates the set of lattice planes that can be obtained from the (11$\bar{2}$0) plane by a symmetry operation. All cleavage planes of the forms {10$\bar{1}$0} and {11$\bar{2}$0} intersect the front face on the Si-side (0001) and the opposite, front face on the C-Side (000$\bar{1}$) (not shown) of 4H—SiC semi-finished product 200 with an angle of 90°. The cleavage planes of the forms {10$\bar{1}$0} and {11$\bar{2}$0} also intersect the lateral surface of the 4H—SiC semi-finished product 200 at a right angle, which means that the 4H—SiC semi-finished product 200 will be prone to fissures when radial forces are applied along the depicted cleavage planes.

Figure 3A:
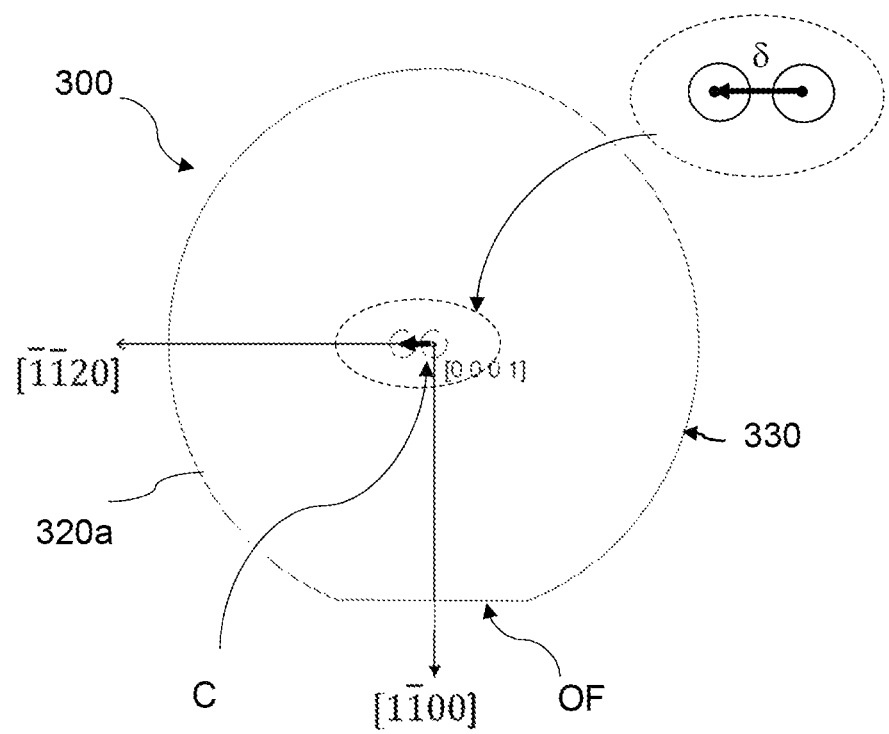
FIG. 3A is a schematic top view of a conventional 4H—SiC substrate with a standard 4° off-axis orientation (viewed from a front face), in which the basal plane (0001) of the 4H—SiC crystal is tilted by an angle δ of 4° in the [$\overline{11}20$] direction with respect to a front face of the 4H—SiC substrate; the short arrow in the inset depicts the vector component of the [0001] direction on the plane of FIG. 2.
Figure 3B:
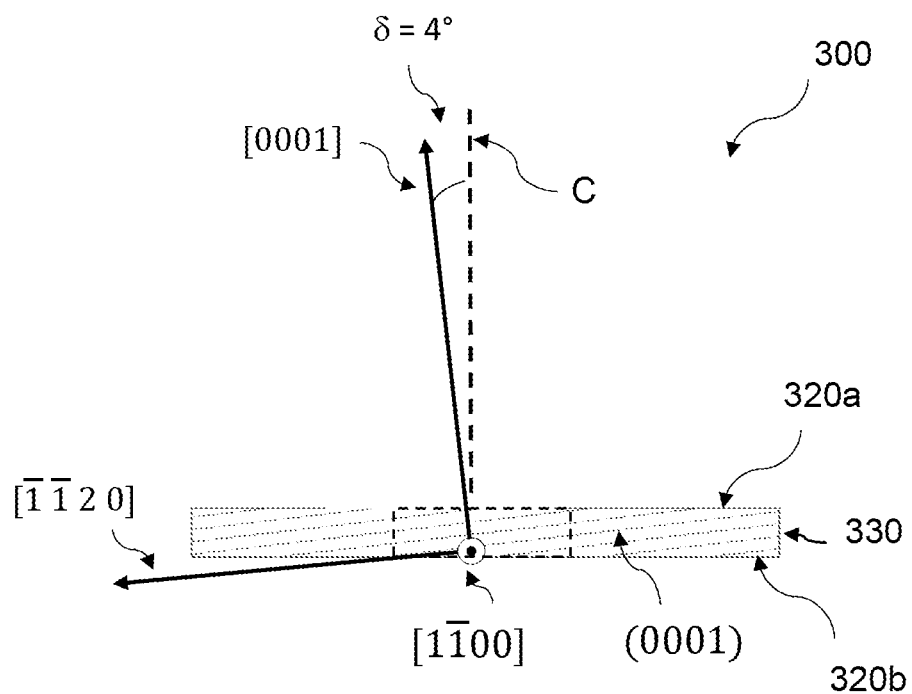
FIG. 3B is a schematic side view of the 4H—SiC substrate shown in FIG. 3A, when viewed from the side containing the [1$\overline{1}00$] crystal direction, and depicts the inclination of the basal plane (0001) and corresponding [0001] axis in the [$\overline{11}20$] direction by the angle δ of 4° (i.e. in the direction parallel to the primary flat OF in FIG. 3A)

An example of a 4H—SiC substrate 300 having a standard 4° off-axis orientation of the basal plane (0001) in the [$\bar{1}\bar{1}$20] direction is depicted in FIGS. 3A and 3B. This 4°-off orientation has prevailed as a standard orientation of 4H—SiC substrates used by the prior art, because it allows achieving the best quality in the epitaxy layers grown thereon and the subsequently processed components. FIG. 3A depicts the standard 4° off-axis orientation of the 4H—SiC substrate 300, when viewed from a top, front face (i.e. from the Si-side (0001)), showing the [1$\bar{1}$00] crystal direction, which is parallel to the substrate front face 320a, and the vector component of the [$\bar{1}\bar{1}$20] direction (which is inclined downwards by 4°) along the front face 320a. The inclination of the [0001]-axis is represented by the short arrow in the inset of FIG. 3A, which depicts the vector component of the [0001] axis along the front face 320Sa. A primary flat is in general defined to indicate the 8 1$\bar{1}$00] direction, although a notch marking the [1$\bar{1}$00] direction could be used instead. A secondary flat could also be provided in the [1̄1̄20] direction. FIG. 3B is a side view of the 4H—SiC substrate 300 depicted in FIG. 3A, when viewed from the 8 11̄00] direction (side of the primary flat OF). As it can be seen from FIG. 3B, the basal plane (0001) of the 4H—SiC crystal is tilted out of the plane parallel to the front face 320a in the crystal direction 8 1̄1̄20] and the respective crystal axis [0001] is inclined with respect to the central axis C of the 4H—SiC semi-substrate by a tilt angle δ of 4° (+/−0.5°).

As mentioned above, the 4° tilt of the basal plane (0001) in the [1̄1̄20] direction allows to achieve an optimal step flow during epitaxy and thus, ensures an optimal quality of the subsequent epitaxial layers grown onto the 4°-off substrate. This tilting of the basal plane (0001) and principal axis [0001] is also reflected in the crystallographic orientation of some cleavage planes. For instance, five of the six cleavage planes of the {101̄0} and {112̄0} forms depicted in FIG. 2 for the on-axis orientation, are no longer orthogonal to the front face(s) 320a, 320b of the 4H—SiC substrate with the 4° off-axis orientation, and consequently, no longer intersect the cylindrical lateral surface 330 at a right angle. Only the cleavage plane (11̄00) still intersects the front face(s) 320a, 320b of the 4H—SiC substrate 300 with an angle of 90°, and remains parallel to the longitudinal axis C. On the other hand, the cleavage plane (1̄1̄20) displays the largest change in the crystallographic orientation with respect to the front face 320a.

Figure 4A:
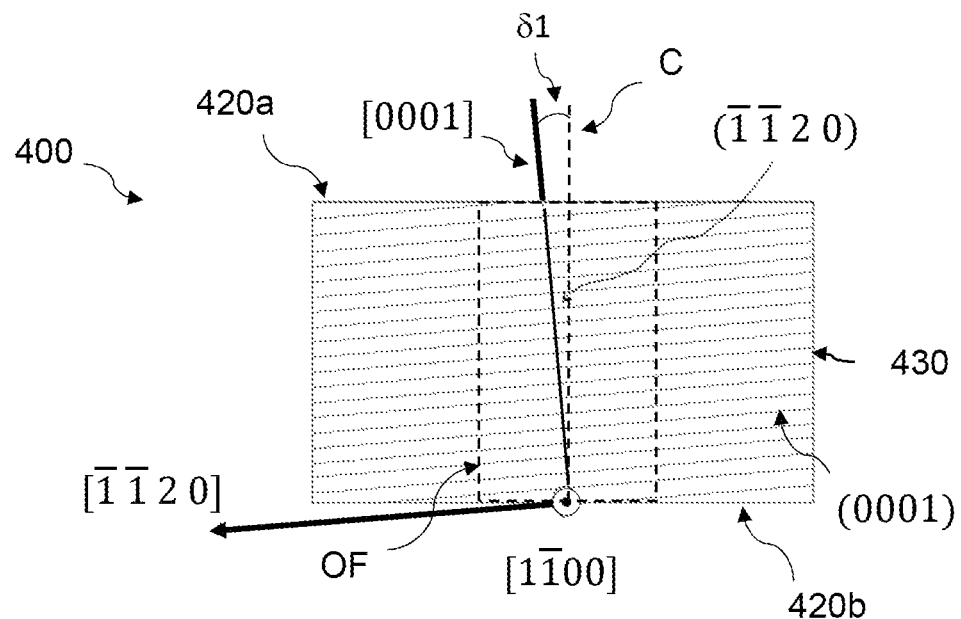
FIG. 4A is a schematic side view of a 4H—SiC semi-finished product with the standard 4° off-orientation, viewed from a side containing the [1$\overline{1}00$] crystal direction (i.e. the side of the primary flat OF), and depicts the inclination of the basal plane (0001) and of the corresponding [0001] crystal direction towards the initial [$\overline{11}20$] direction by a tilt angle δ of 4°.
Figure 4B:
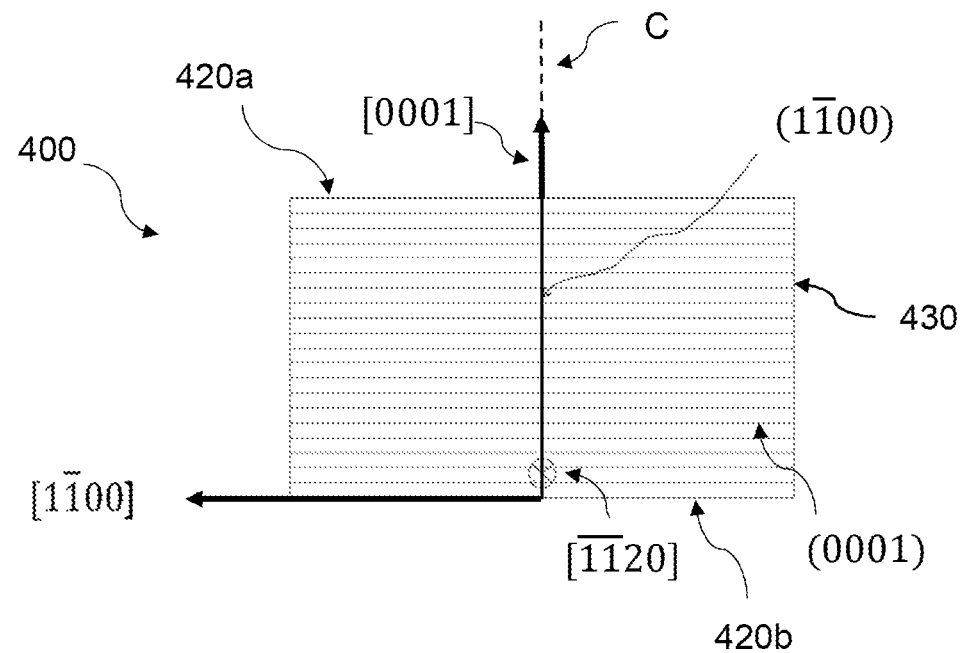
FIG. 4B is a further schematic side view of the 4H—SiC semi-finished product shown in FIG. 4A, when viewed from a side opposite to the initial [$\overline{11}20$] direction, and depicts the orientation of a cleavage plane ($1\overline{1}00$) which is parallel to the central symmetry axis C of the 4H—SiC cylinder.

A similar situation occurs in a monocrystalline 4H—SiC semi-finished product 400 having the standard 4° off-axis orientation, such as illustrated in FIGS. 4A-4B. FIG. 4A shows a side view of the 4H—SiC semi-finished product 400, viewed from the [11̄00] direction (i.e. from the side of the primary flat OF), and depicts the orientation of the crystalline directions [1̄1̄20], [11̄00] and [0001] with respect to the front face 420a (on the Si-side (0001)) and the cylinder central axis C, as well as the inclination of the cleavage plane (1̄1̄20). As it can be seen from FIG. 4A, the cleavage plane (1̄1̄20) no longer intersects the front face 420a at a right angle, and consequently, it is no longer aligned in parallel with the central axis C, but rather exhibits an inclination of 4° with respect to the central axis C due to the 4° off-axis orientation of the basal plane (0001) and respective [0001] crystalline axis. On the other hand, the [11̄00] direction remains transverse to the central axis C.

FIG. 4B shows a further side view of the 4H—SiC semi-finished product illustrated in FIG. 4A, now viewed from a direction that makes 90° with the [11̄00] crystalline direction (i.e. from a side opposite to the [1̄1̄20] direction before tilting the basal plane (0001)). As it can be seen from FIG. 4B, the [11̄00] direction remains transverse to the central axis C of the 4H—SiC semi-finished product 400 and the cleavage plane (11̄00) is the only lattice plane that has not changed orientation with the tilting of the basal plane (0001) by 4° in the direction [1̄1̄20]. Therefore, the cleavage plane (11̄00) continues to intersect the front face 420a (and 420b) at a right angle and remains parallel to the cylinder central axis C. The crystal direction [1̄1̄20] is no longer perpendicular to the central axis C, as it is tilted by 4° downwards with respect to the front face 420a (this is illustrated in FIG. 4B by the vertical displacement of the symbol representing the tail of the vector in the direction [1̄1̄20]). The intersection of the parallel basal planes (0001) with the lateral side 430 of the 4H—SiC semi-finished product 400 is represented in FIG. 4B by the horizontal lines. Except for the (11̄00) planes, all other remaining cleavage planes of the respective forms {101̄0} and {112̄0}, change their orientation with respect to the front face 420a, after the 4° tilting of the basal plane (0001), the respective inclination angles falling between the maximum change by 4° exhibited by the cleavage planes (1̄1̄20) and the zero change of the cleavage planes (11̄00).

However, in either the on-axis or the 4° off-axis orientation, the 4H—SiC semi-finished products or 4H—SiC substrates are still very prone to fissures during mechanical processing, in particular when radial mechanical forces are applied at regions where cleavages planes intersect their respective cylindrical surfaces in alignment with the symmetry axis C, as it is the case for the cleavage planes (11̄00) described above.

Figure 5:
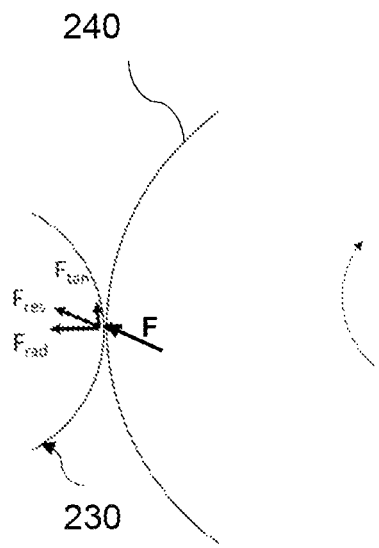
FIG. 5 is a top view depicting the components of the mechanical force F applied onto the lateral side of a 4H—SiC semi-finished product (or substrate) by a grinding wheel.
Figure 6:
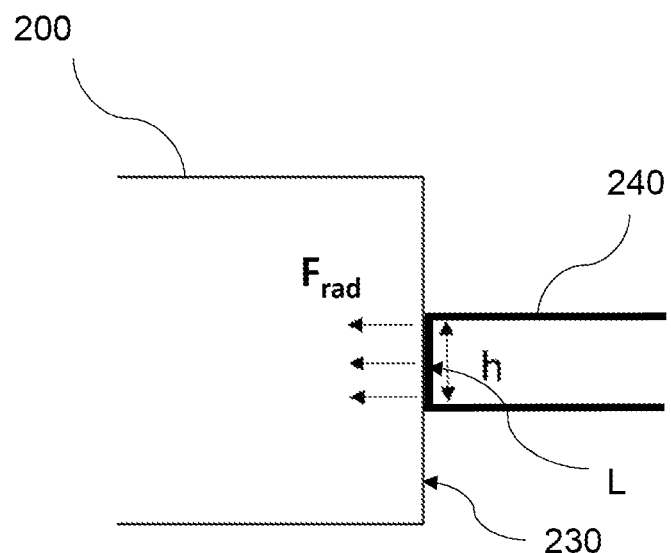
FIG. 6 is a side view depicting the radial mechanical force applied onto the 4H—SiC semi-finished product (or substrate) by the grinding wheel.

As illustrated in FIG. 5, during mechanical processing of monocrystalline SiC semi-finished products (or substrates), it can be assumed, in a first approximation, that the tool used during a mechanical processing, such as grinding, applies a mechanical force F along a line segment L (force line segment) on the surface of the single-crystal body and which propagates radially into the single-crystal body. The decisive factor in terms of cleavage is the intensity of the force exerted inwards onto the single-crystal SiC semi-finished product, i.e. the radial component $F_{rad}$ of the total force F. Tangential force components ($F_{tang}$) that might occur during machining can be neglected for the purpose of evaluating its effect on cleavage. The length of line segment L is approximately the length of the contact region with the respective processing tool, such as the thickness h of a grinding wheel, as illustrated in FIG. 6. In fact, during machining, the mechanical force is not applied along a single line segment L of length h, but rather onto a very narrow area of the same h. This narrow area can be regarded as being formed by a series of parallel line segments. The conditions for achieving a reduction of cleavage along a line segment according to the principles of the present invention, which will be explained below, are then applicable to each of these individual lines.

For the purpose of evaluating the effect of the radial mechanical force applied inwards onto the cleavage planes at the contact region, we take into account both the contact region as well as the actual length of the line segment(s) L onto which the mechanical force is actually applied. The length h of the line segment L and/or narrow area is essentially determined by the thickness h of the processing tool.

During mechanical processing of a SiC semi-finished product with the standard 4° off-axis orientation illustrated above with reference to FIGS. 4A-4B, or with an on-axis orientation as illustrated in FIG. 2, radial forces are applied transversally at several positions along the outer perimeter of the crystal cylindrical surface, for e.g. by a grinding wheel. The effect of the applied force on the development or not of fissures on the crystal is highly dependent on the position/region along the cylinder perimeter where this force is applied. The following extreme situations can be distinguished with regard to the orientation of the different cleavage planes in relation to the application region of the radial force, as illustrated in FIGS. 7 and 8.

Figure 7:
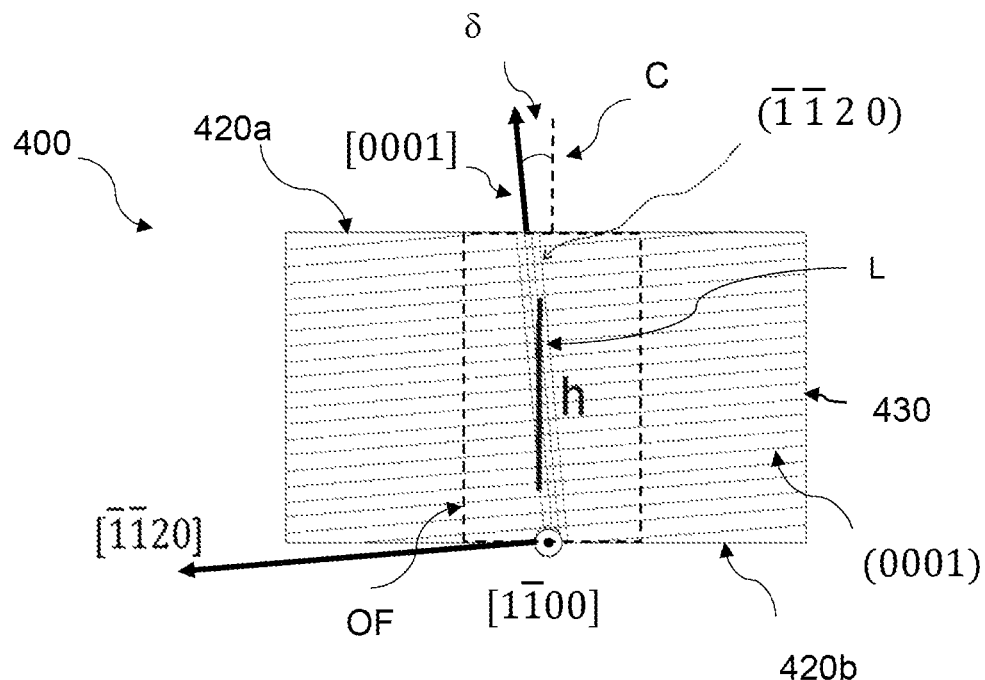
FIG. 7 a further schematic side view of the 4H—SiC semi-finished product with the standard 4° off-orientation, when viewed from the direction [$\overline{1}100$] (i.e. viewed from side of the primary flat OF) and depicts the intersection of lattice planes ($\overline{11}20$) by a force line segment L.

FIG. 7 shows a further schematic side view of the 4H—SiC semi-finished product 400 with the standard 4° off-axis orientation, when viewed from the direction [11̄00] (i.e. viewed from the primary flat OF), and representing the cleavage planes (1̄1̄20) intersected by a force line segment L along which the mechanical force is applied (where h represents the thickness of the grinding wheel). As depicted in FIG. 7, the inventors have recognized that, because the cleavage planes (1̄1̄20) are not parallel to the cylinder axis C in the standard 4° off-axis orientation, and therefore, are not transverse to the front face 420*a* of the 4H—SiC semi-finished product 400, the radial force applied, in a first approximation, along the line segment L in the direction [1$\overline{1}$00], for e.g. by a grinding wheel, is simultaneously applied not only on one ($\overline{1}\overline{1}$20) plane but rather on the plurality of parallel cleavage planes ($\overline{1}\overline{1}$20) that intersect the lateral surface of the 4H—SiC semi-finished product 400 at this force line segment L of length h. Based on the atomic distances in the 4H—SiC crystal structure, it is estimated that the radial force actuating along the line segment L is distributed over a number of equivalent, parallel cleavage planes of the form ($\overline{1}\overline{1}$20), e.g. the cleavage planes ($\overline{1}\overline{1}$20), which is up to 2.6×10$^5$ planes per mm, in the case of the illustrated 4° off-axis orientation. This means that the force applied onto each individual cleavage plane ($\overline{1}\overline{1}$20) is strongly reduced, and therefore, the risk for propagation of fissures within the individual parallel cleavage planes can be significantly reduced.

Figure 8:
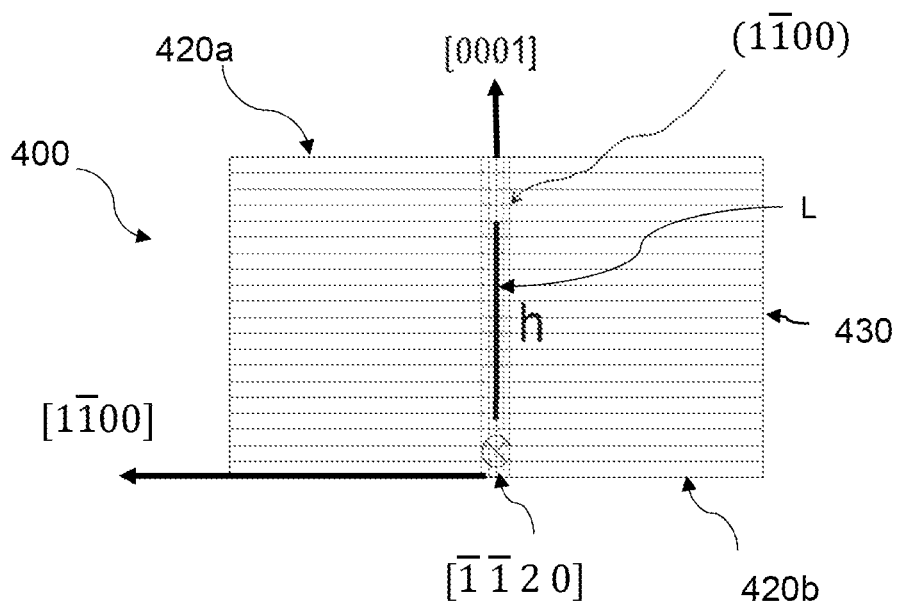
FIG. 8 is a further schematic side view of the 4H—SiC semi-finished product shown in FIG. 7, now viewed in the [$\overline{11}20$] direction, and depicts the intersection of lattice planes (1$\overline{1}00$) by a further force line segment L.

FIG. 8 is a further schematic side view of the 4H—SiC semi-finished product 400 shown in FIG. 7, now viewed from the side opposed to the [$\overline{1}\overline{1}$20] direction, and illustrates the other extreme situation which occurs when radial forces are applied along a line segment L parallel to the C axis and positioned at the [11$\overline{2}$0] direction. As depicted in FIG. 8, the inventors have recognized that the cleavage planes (1$\overline{1}$00) are oriented at a right angle with respect to the front face 420*a* of the 4H—SiC semi-finished product 400 and intersect the cylindrical lateral surface 430 along a line parallel to the central axis C, from the bottom front face 420*b* up to the upper front face 420*a*. In this case, in a first approximation, the radial force is applied by the grinding wheel along the line segment L in the direction [11$\overline{2}$0] but can only be distributed over a single or very few of the parallel, cleavage planes (1$\overline{1}$00). Consequently, since in this case the applied force will not be distributed over a large number of cleavage planes (1$\overline{1}$00), as opposed to the situation illustrated in FIG. 7 for the cleavage planes ($\overline{1}\overline{1}$20), the maximum force applied during machining is actually applied over a single or a reduced number of cleavage planes (1$\overline{1}$00). This results in a very high probability of cracking, which can easily lead to the breakage of the single-crystal SiC semi-finished product 400 during mechanical processing.

All other remaining cleavage planes in the forms {10$\overline{1}$0} and {$\overline{1}\overline{1}$20} are not parallel to the C axis due to the 4° tilting of the basal plane (0001) in the direction [$\overline{1}\overline{1}$20] and exhibit a behaviour in terms of robustness to cleavage that lies between the two extreme cases described above for the cleavage planes ($\overline{1}\overline{1}$20) and (1$\overline{1}$00).

From the above, it follows that the cleavage plane (1$\overline{1}$00) remains by far the most sensitive cleavage plane against fissures and cracks during mechanical processing, so that the occurrence of cracks along these cleavage planes is highly probable. Thus, the inventors have realized that the standard 4° off-axis orientation of the 4H—SiC semi-finished product, which is used in the prior art for the different purpose of improving the quality of epitaxy of materials to be grown onto the 4H—SiC substrates, may bring a beneficial, surprising effect with regard to the reduction of cleavage along certain crystal directions, but this positive effect is not achieved at every position along the perimeter of the cylindrical surface of the 4H—SiC semi-finished product or the 4H—SiC semi substrate, in particular, at the positions where the cleavage planes (1$\overline{1}$00) intersect the outer cylinder surface.

The present invention provides a method and a monocrystalline 4H—SiC semi-finished product that solves the problem related to the fissures/cracks formed along the crystal cleavage planes, namely, the cleavage planes (1$\overline{1}$00) in case of a 4H—SiC semi-finished product with an off-axis orientation, such as the 4° off-axis orientation described above.

In the following, the principles of the present invention will be described with respect to the case of a 4H—SiC semi-finished product with 4° off-axis orientation in the [$\overline{1}\overline{1}$20] direction for the sake of simplicity. However, the present invention may be applied to mono-crystalline SiC semi-finished products (or substrates) of modifications other than the 4H—SiC, and/or to other mono-crystalline semiconductor materials having other off-axis orientations and that exhibit preferred cleavages planes oriented transversally to the front faces of the bulk crystal and/or substrate.

A principle underlying the present invention lies in making possible to reduce or even prevent the susceptibility of the 4H—SiC crystal structure to cracking along preferred cleavage planes, such as the planes (1$\overline{1}$00), by setting a specific crystallographic orientation of the 4H—SiC crystal structure on the 4H—SiC semi-finished product (or a 4H—SiC substrate), while maintaining the benefits that an off-axis orientation of the direction [0001] brings to the epitaxy qualities of the respective 4H—SiC substrates.

In order to reduce or avoid the formation of cracks on a 4H—SiC semi-finished product with a 4°-off orientation (4°±0.5°), the present invention sets a specific orientation of the crystal structure on the 4H—SiC semi-finished products (or 4H—SiC substrates) with respect to the respective external surface(s), such as the lateral surface and/or one or both of the front faces of the 4H—SiC semi-finished product. The occurrence of cracks may be reduced or even avoided for an orientation of the cleavage planes (1$\overline{1}$00) that satisfies the condition of being so oriented that the radial force applied during mechanical processing is distributed over at least a predetermined minimum number of parallel cleavage planes (1$\overline{1}$00) per unit length of the force line segment L, and irrespectively on the position around the outer perimeter of the 4H—SiC semi-finished product.

The minimum number of cleavage planes (1$\overline{1}$00) per unit length of the force line segment L may be estimated based on the atomic distances in the 4H—SiC crystal lattice. The inventors have found that a reduction in the occurrence of cracks/fissures can be achieved with a minimum number of 1.000 equivalent, parallel cleavage planes (1$\overline{1}$00) per mm of the force line segment L. A preferred number of intersecting planes (1$\overline{1}$00) corresponds to 1.500 equivalent, parallel cleavage planes per mm of the force line segment length. It was further estimated that the desired increase in robustness against cleavage may be achieved, without affecting the epitaxy properties of the 4°-off SiC semi-finished product or substrate, for any number of intersecting cleavage planes up to a maximum number of 10.000 equivalent, parallel cleavage planes per mm of the force line segment.

The distribution of the applied mechanical force over a large number of parallel cleavage planes (1$\overline{1}$00) per length of the force line segment allows to reduce the probability of cracking. Nevertheless, as the number of cleavage planes (1$\overline{1}$00) intersecting the line force segment L is closely related with their inclination with respect to the cylinder front faces, it is desirable to keep the degree of inclination of the cleavage planes (1$\overline{1}$00) as low as possible, such as not to affect negatively the quality of the epitaxial growth on the final substrates, and therefore, the number of planes intersecting the force line segment, while still achieving the desired effect of improved robustness against cleavage of the 4H—SiC semi-finished product and the substrates made therefrom.

Exemplary embodiments of 4H—SiC semi-finished products having a predetermined orientation of the underlying 4H—SiC crystal structure that improves mechanical robustness according to the present invention, and more specifically, of the cleavage planes (1$\bar{1}$00), are illustrated in FIGS. 9A-9B and FIGS. 10A-10B. The relative dimensions and angles used in FIGS. 9A-9B and FIGS. 10A-10B are only intended for the purpose of facilitating understanding and are not to scale. The exemplary predetermined orientations are also applicable to 4H—SiC substrates.

Figure 9A:
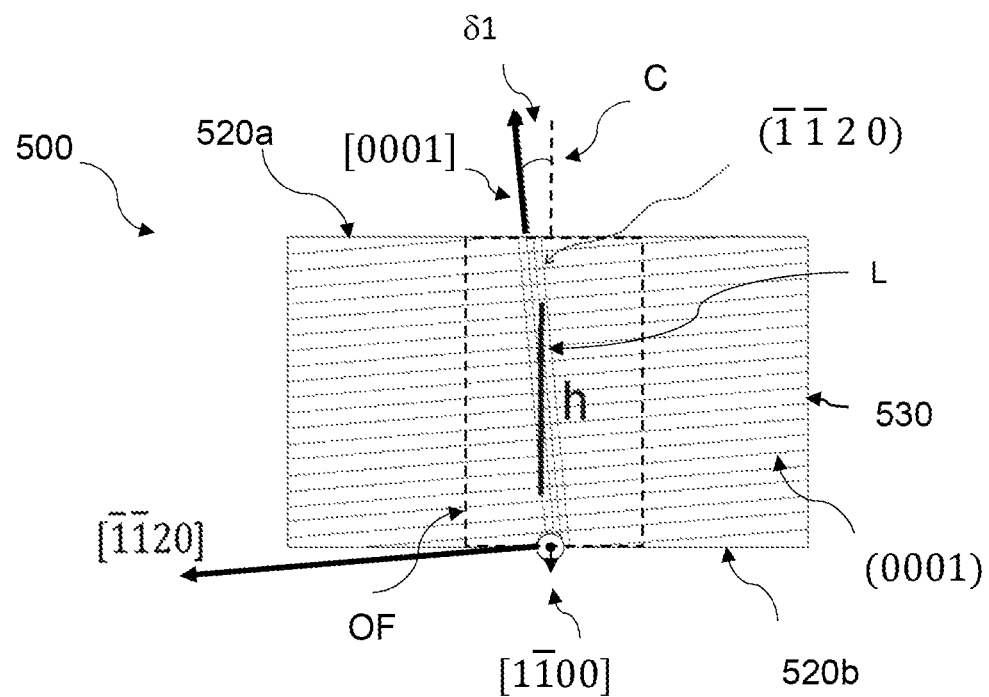
FIG. 9A is a schematic side view (viewed in the [1$\overline{1}00$] direction) of a 4H—SiC semi-finished product with a predetermined crystal orientation according to an exemplary embodiment, in which the basal plane (0001) is inclined by a first tilt angle $\delta_1$ in the [$\overline{11}20$] direction and is additionally tilted by a second tilt angle $\delta_2$ in the 8 1$\overline{1}00$] direction in a counter-clockwise manner; an exemplary force line segment L along which a radial force may be exerted onto the lateral surface of the 4H—SiC semi-finished product during mechanical processing is also depicted.
Figure 9B:
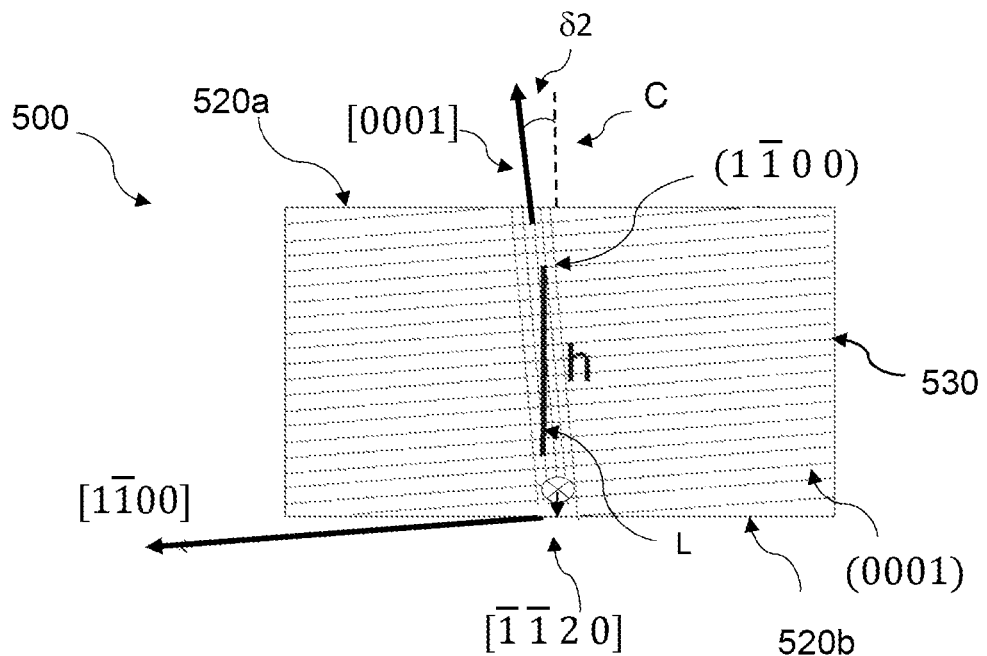
FIG. 9B is a further schematic side view of the 4H—SiC semi-finished product shown in FIG. 9A and depicts the inclination of the basal planes (0001) and the cleavage planes (1$\bar{1}$00) due to the tilt by the second tilt angle $\delta_2$ (viewed in the [$\bar{1}\bar{1}$20] direction)

FIGS. 9A-9B illustrate schematically a 4H—SiC semi-finished product 500 according to an exemplary embodiment, in which the spatial orientation of the 4H—SiC crystal structure with respect to the longitudinal axis C of the 4H—SiC semi-finished product 500 (or with respect to one or both of its front ends 520a, 520b and/or lateral surface 530), in addition to an off-axis orientation of the basal plane (0001) in the direction [$\bar{1}\bar{1}$20] by a first tilt angle $\delta_1$ (for e.g. $\delta_1=4°\pm0.5°$ as depicted in FIG. 9A), further includes a tilt of the basal plane (0001) by a non-zero, second tilt angle $\delta_2$ in the [1$\bar{1}$00] direction, as shown in FIG. 9B. Consequently, not only the cleavage planes ($\bar{1}\bar{1}$20) are tilted with respect to the central axis C of the 4H—SiC semi-finished product 500 by the tilt angle $\delta_1$, as shown in FIG. 9A, but also the cleavage planes (1$\bar{1}$00) are inclined with respect to the central axis C by the tilt angle $\delta_2$, as shown in FIG. 9B. Thus, assuming in a first approximation that a processing tool applies radial forces along a line segment L of length h on the curved lateral surface 530, which is defined as the line segment on a plane tangent to the lateral surface 530 at the region of contact, there is always a plurality of parallel cleavage planes of the form {10$\bar{1}$0} per unit length that intersect the force line segment L, irrespectively of the position of the line segment L (i.e. the region where the radial force is being applied) along the outer perimeter of the 4H—SiC semi-finished product 500.

Thus, a situation in which the radial force applied during a grinding process is exerted onto a single or only a few cleavage planes (1$\bar{1}$00) at certain positions, such as described with reference to FIG. 4B above, does not occur in the 4H—SiC semi-finished product 500 with the predetermined orientation described above.

Furthermore, by estimating the value of the second tilt angle $\delta_2$ that yields the at least predetermined minimum number of intersecting, parallel cleavage planes of the {10$\bar{1}$0} form per unit length of the line segment, and at which the radial force applied per unit plane becomes lower than a given cleavage threshold characteristic of the specific cleavage plane, the occurrence of fissures during mechanical processing of the 4H—SiC semi-finished product 500, or of a 4H—SiC substrate with the same predetermined orientation, can be significantly reduced or even avoided in a controlled manner.

Figure 10A:
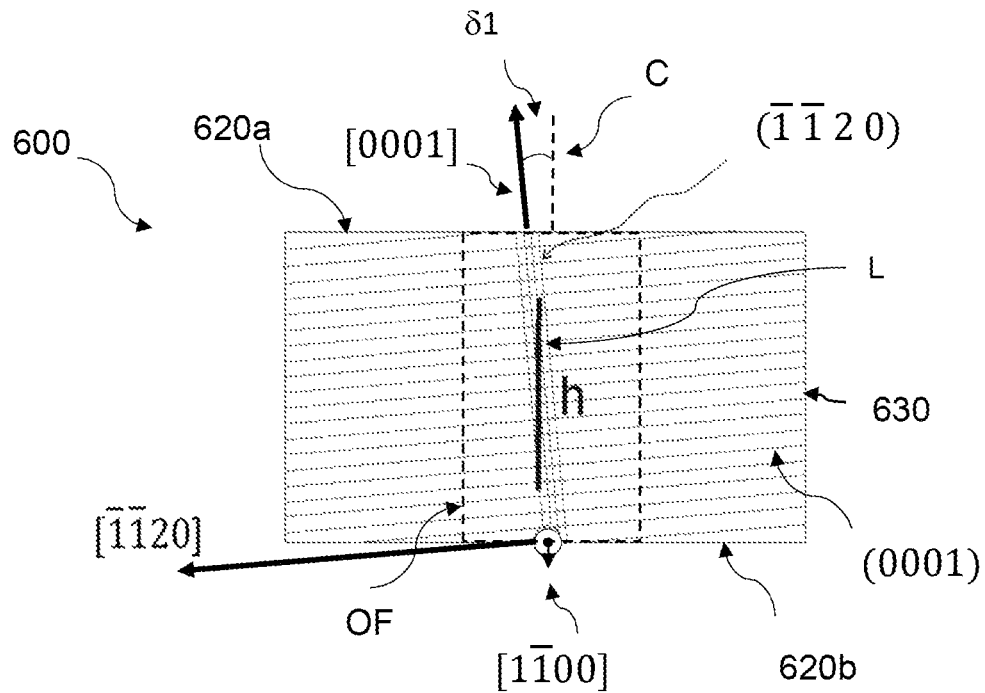
FIG. 10A is a schematic side view (viewed in the 8 1$\bar{1}$00] direction) of a 4H—SiC semi-finished product with a predetermined crystal orientation according to a further exemplary embodiment, in which the basal plane (0001) is inclined by a first tilt angle $\delta$ in the [$\bar{1}\bar{1}$20] direction and by a second tilt angle $\delta_2$ in the [$\bar{1}$100] direction.
Figure 10B:
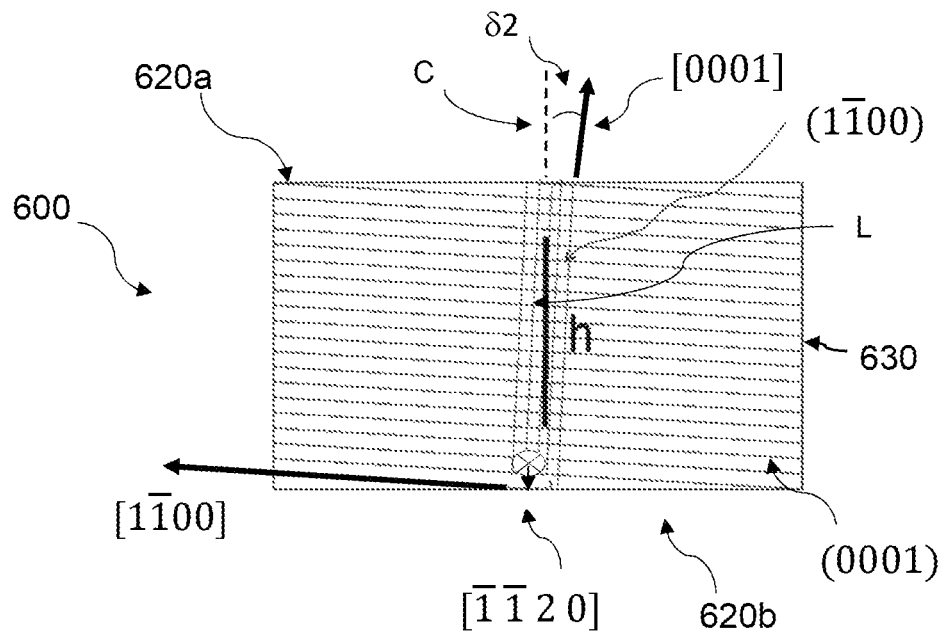
FIG. 10B is a further schematic side view (viewed in the 8 $\bar{1}\bar{1}$20] direction) of the 4H—SiC semi-finished product (or substrate) shown in FIG. 10A and depicts the inclination of the basal planes (0001) and the cleavage planes (1$\bar{1}$00) due to the tilt by the second tilt angle $\delta_2$.

FIGS. 10A-10B illustrates schematically a 4H—SiC semi-finished product 600 having another predetermined orientation for improving mechanical robustness according to a further exemplary embodiment. In this configuration, the 4H—SiC crystal structure has a predetermined spatial orientation with respect to the longitudinal axis C (or with respect to one or both of its front ends 620a, 620b and/or lateral surface 630 of the 4H—SiC semi-finished product 600) such that, in addition to an off-axis orientation of the [0001] direction, and respective basal plane (0001), in the direction [$\bar{1}\bar{1}$20] by a first tilt angle $\delta_1$ (for e.g. $\delta_1=4°\pm0.5°$ as depicted in FIG. 10A), further includes a tilt of the basal plane (0001) by a non-zero, second tilt angle $\delta_2$ in the [$\bar{1}$100] direction, as shown in FIG. 10B. In this spatial orientation, the cleavage planes (1$\bar{1}$00) are then inclined with respect to the central axis C of the 4H—SiC semi-finished product 600 by the angle $\delta_2$. Thus, similarly to the embodiment of FIGS. 9A-9B, any force line segment L on the lateral surface 630 that is parallel to the central axis C will be intersected by at least a predetermined minimum number of parallel cleavage planes of the form {10$\bar{1}$0} per unit length of the force line segment L, irrespectively of the position on the lateral surface 630 where the line segment L is defined, and consequently, of the position where the radial force is applied during a grinding process. Also in this case, the value of the second tilt angle $\delta_2$ may be estimated such as to achieve the at least predetermined minimum number of intersecting, parallel cleavage planes of the {10$\bar{1}$0} form per unit length of the line segment at which the radial force per cleavage plane becomes lower than a given cleavage threshold.

The second tilt angle $\delta_2$ may be estimated based on the known distance between two, equivalent parallel cleavages planes of the of the {10$\bar{1}$0} form, such as the (1$\bar{1}$00) planes, and/or taking into account the parameters of the mechanical process (e.g. height h of the grinding tool at the contact region, typically applied forces and grinding speed, etc.), and/or a known cleavage threshold for the specific type of cleavage plane. Alternatively, the second tilt angle $\delta_2$ may be determined and adjusted by means of experimentation.

Both exemplary embodiments share a principle of the present invention of distributing the external mechanical force over a plurality of equivalent, parallel cleavage planes (1$\bar{1}$00) per unit length of the force line segment L for reducing or even eliminating the occurrence of cracks, irrespectively of the position around the whole perimeter of the SiC semi-finished product where such external mechanical forces are to be applied.

A similar improvement of mechanical robustness against cleavage is also achieved in 4H—SiC substrates or wafers having the same spatial orientation of the 4H—SIC crystal structure described above with reference to FIGS. 9A-9B and FIGS. 10A-10B.

The predetermined orientation of the 4H—SIC crystal structure may be set on the 4H—SiC semi-finished product by the methods described below.

In a raw 4H—SiC crystal as obtained after crystal growth and/or after a first, rough mechanical processing (pre-processed 4H—SiC crystal), the lattice planes and the reference surfaces (e.g. one of the processed frontal faces or cylinder surface) are not yet aligned with the required exact orientation with respect to each other, as in the final 4H—SiC semi-finished product.

For this reason, at the beginning of the mechanical processing, the raw 4H—SiC crystal (or the pre-processed 4H—SiC crystal) is mounted with one of its frontal faces (Si side (0001) or C side (000$\bar{1}$)) on a goniometer and/or support, and is glued or cemented thereto in order to allow a precise setting of the crystal orientation for the mechanical processing. For this orientation, commercial x-ray devices can be used and with which the orientation of the lattice planes can be exactly determined and aligned. Accordingly, in order to set a 4° off-axis orientation, in a first step, the raw crystal orientation is adjusted with the goniometer in the x-ray device such that the basal plane (0001) (or (000$\bar{1}$) plane) is accurately orientated along a direction orthogonal to the future cylinder surface (i.e. with the [0001] axis aligned along the C axis), which will be defined in a subsequent mechanical processing (for example, by a grinding process).

In a subsequent step, the so orientated raw SiC crystal (or pre-processed SiC single-crystal) is tilted by 4° (+/−0.5°) in the direction [$\bar{1}\bar{1}20$] using the goniometer, in order to provide the desired 4° off-axis orientation of the basal plane, as required for a good quality epitaxy of the future SiC substrates. After this positioning, the lattice planes are orientated as shown in FIG. 4A and FIG. 4B. In this case, the angle between the [0001] axis of the basal plane and the future cylinder axis C is 4° (+/−0.5°).

Thereafter, the outer diameter of the cylinder is set to the diameter of the future substrates, for example by a grinding process. The process of diameter setting is one of the most critical steps with regard to the occurrence of cracks, as explained above. During this setting process, it is ensured that the previous goniometer-adjusted orientation of the lattice planes with respect to the cylinder surface is accurately transferred. Furthermore, the main or secondary orientation flats and/or notch can be grinded during this process step. The desired orientation of the lattice planes with respect to the cylinder surface is subsequently checked/controlled using an x-ray device, prior to any further processing.

After the processing of the outer diameter and/or orientation flats, and the control of the desired orientation of the lattice planes with respect to the cylinder surface, a process for defining the frontal faces of the SiC single-crystal is performed, thereby yielding the final SiC semi-finished product with an external shape similar to the shape illustrated in FIG. 1.

In order to set the predetermined spatial orientation of the lattice planes ($1\bar{1}00$) that improves mechanical robustness, such as the predetermined orientation depicted in FIGS. 9A-9B or FIGS. 10A-10B, the raw SiC crystal (or pre-processed SiC crystal) is submitted to a process of setting the desired predetermined orientation which includes spatially orienting the raw (or pre-processed) SiC crystal, such as by using any of the following orientation process sequences. Each step of the orientation process sequence is preferably performed using a goniometer and a commercial x-ray device to ensure a precise orientation at each step of the process sequence.

According to a first orientation process sequence for setting a predetermined orientation of the SiC crystal structure in a 4H—SiC semi-finished product 500, such as illustrated in FIGS. 9A-9B, the raw or pre-processed 4H—SiC crystal is spatially oriented such that the basal plane is first aligned to an initial orientation, in which the basal plane makes a substantially right angle with the direction of an alignment central axis C (which corresponds to the direction of the future cylindrical lateral surface 530 of the final 4H—SiC semi-finished product 500). In a subsequent step, the basal plane is tilted by a first tilt angle $\delta_1$ in the [$\bar{1}\bar{1}20$] direction from the initial orientation into a first orientation by inclining the 4H—SiC crystal by the same amount $\delta_1$ in the [$\bar{1}\bar{1}20$] direction. The so oriented SiC crystal is then inclined by a second tilt angle $\delta_2$ in the [$1\bar{1}00$] direction, which results in the basal plane (0001) being tilted from the first orientation into a second orientation by the second tilt angle $\delta_2$ in the [$1\bar{1}00$] direction.

According to an alternative, second orientation process sequence for setting a predetermined orientation of the SiC crystal structure in a 4H—SiC semi-finished product 600, such as illustrated in FIGS. 10A-10B, the basal plane is also first oriented into an initial orientation that makes a right angle with the direction of a central axis C (which corresponds to the direction of the future cylindrical lateral surface 630). The basal plane is then tilted by a first tilt angle $\delta_1$ in the [$\bar{1}\bar{1}20$] direction from the initial orientation into a first orientation. The so oriented raw or pre-processed SiC crystal is then inclined by a second tilt angle $\delta_2$ in the [$\bar{1}100$] direction, such that the basal plane (0001) is tilted from the first orientation into a second orientation by the additional tilt angle $\delta_2$ in the [$\bar{1}100$] direction.

In the first and second orientation process sequences described above, the value of the first tilt angle is preferably 4°±0.5°, where the error of ±0.5° is associated with an acceptable tolerance in the value of the first tilt angle that still allows obtaining the desired improvement in the epitaxy properties of the respective semiconductor substrates. The value of the second tilt angle $\delta_2$ is preferably 0.023°. However, any value within the range of [0.015°; 0.153°] may be used for the second tilt angle $\delta_2$, at which the desired effect of orientation onto the mechanical robustness can be achieved. In particular, the value of the second tilt angle $\delta_2$ to be used may be estimated based on the distance between the equivalent, parallel cleavages planes of the 4H—SiC lattice and whose cleavage effect is intended to be minimized, and by reference to the at least predetermined minimum number of intersecting cleavage planes per unit length of a force line segment described above.

According to a third orientation process sequence for setting a further predetermined orientation that improves mechanical robustness, the basal plane is first aligned to a initial orientation that makes a right angle with respect to the direction of the central axis C, i.e. the direction of the future cylindrical lateral surface. The basal plane is then rotated about this initial direction by a predetermined rotation angle in a clockwise direction. The predetermined rotation angle is 0.33° or a value within the range [0.22°; 2.19°]. In a subsequent step, the basal plane is further tilted by a third tilt angle $\delta_3$ in the [$\bar{1}\bar{1}20$] direction of the 4H—SiC crystal structure. The third tilt angle is preferably 4°, with a tolerance of ±0.5°.

Alternatively, a fourth orientation process sequence may be used, in which the basal plane is also first aligned to a initial orientation that makes a right angle with respect to the direction of the central axis C, i.e. the direction of the future cylindrical lateral surface. The basal plane is then rotated about this initial direction by a predetermined rotation angle in a counter-clockwise direction. The predetermined rotation angle is preferably 0.33° but it may be any value within the range [0.22°; 2.19°] for obtaining the desired effect of orientation onto the mechanical robustness. In a subsequent step, the basal plane is further tilted by a third tilt angle $\delta_3$ in the [$\bar{1}\bar{1}20$] direction of the 4H—SiC crystal structure, preferably by 4°±0.5°.

After the crystallographic directions of the raw SiC crystal (or pre-processed SiC crystal) have been aligned by any of the orientation process sequences described above, one or more external reference surfaces of the final 4H—Si semi-finished product may be machined with reference to the alignment axis C. For instance, a at least partially curved lateral surface may be machined on the oriented raw or pre-processed SiC crystal in a direction parallel to the alignment axis C. In addition, or alternatively, one or two front faces of the final 4H—Si semi-finished product may be machined in a direction orthogonal to the C axis.

Thus, the predetermined orientation of the basal plane (0001) and other lattice planes of the 4H—SiC structure can be accurately set with respect to at least one reference surface of the 4H—SiC semi-finished product, i.e. the curved lateral surface and/or one or both of its front faces.

The diameter of the curved lateral surface may be set to substantially correspond to an intended diameter of the substrate wafers to be sliced from the 4H—SiC semi-finished product. In particular, the technique of the present invention may be applied to improve mechanical robustness of 4H—Si semi-finished products, and 4H—SiC substrates obtained therefrom, that have an outer diameter of 150.0 mm±0.5 mm, 200.0 mm±0.5 mm, or 250 mm±0.5 mm. The error of ±0.5 mm in the outer diameter corresponds to the tolerance associated with standard grinding processes. However, the diameter tolerance may be higher or lower than 0.5 mm, depending on the technique used for setting the lateral surface and/or adjusting the outer diameter of the 4H—SiC semi-finished product.

Furthermore, the technique of the present invention may be applied to improve mechanical robustness of 4H—Si semi-finished products having a height in the direction of the longitudinal axis C that is larger than 20 mm, or preferably, larger than 15 mm. Nevertheless, the present invention is also applicable to 4H—SiC semi-finished products or raw 4H—SiC crystals of any height that is previously selected to yield a desired number of 4H—SiC substrate slices.

The SiC semi-finished product set with the predetermined orientation of the 4H—SiC lattice for improving mechanical robustness can be subsequently divided into substrate wafers using commonly known wafer separation processes, like multi-wire sawing with diamond-based slurry, wire-based spark corrosion, or other alternative separation processes. This predetermined orientation of the 4H—SiC lattice may be transferred into the substrate wafer by referring to any of the reference surfaces of the SiC semi-finished product during the separation process.

Figure 11:
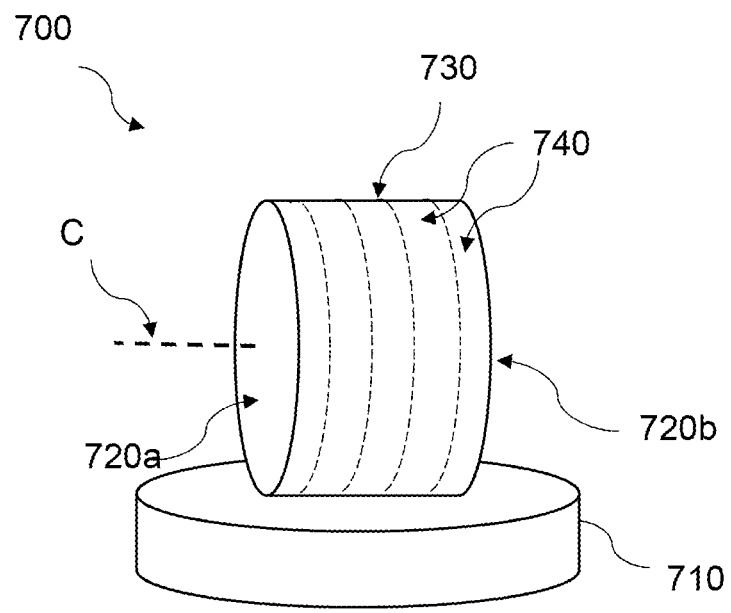
FIG. 11 shows schematically a support configuration of a monocrystalline SiC semi-finished product for transferring the preset crystal orientation from the SiC semi-finished product to individual SiC wafers, during a wafer separation process, by reference to the cylindrical lateral surface of the SiC semi-finished product, according to an embodiment.
Figure 12:
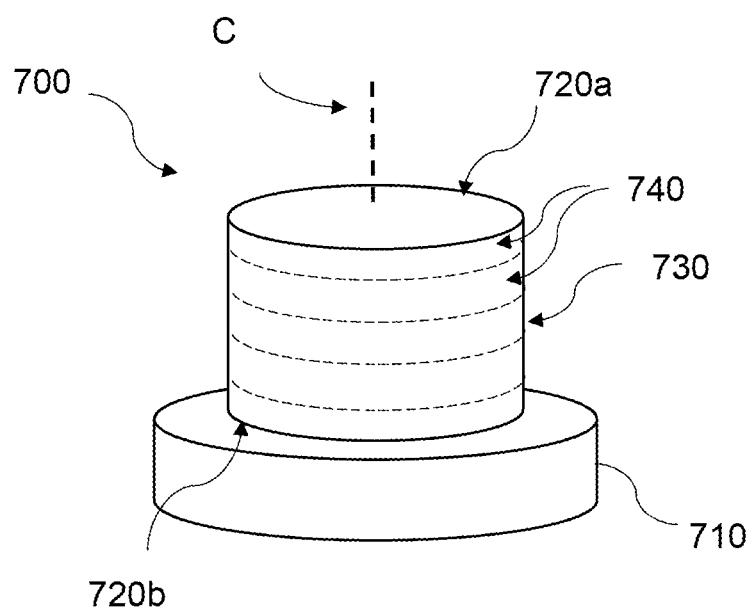
FIG. 12 shows schematically a further support configuration of a monocrystalline SiC semi-finished product for transferring the preset crystal orientation from the SiC semi-finished product to individual SiC wafers, during a wafer separation process, by reference to one of the frontal faces of the SiC semi-finished product, according to an embodiment.

Alternative exemplary embodiments for supporting the SiC semi-finished product during a wafer separation process and transfer the predetermined orientation of the underlying 4H—SiC lattice into the SiC substrates are illustrated in FIGS. 11 and 12.

FIG. 11 illustrates a configuration in which the transfer of the crystal orientation of a monocrystalline SiC semi-finished product 700, such as any of the monocrystalline SiC semi-finished products 500 and 600 described above, to a SiC substrate 740 is performed via the cylinder lateral surface 730. In the case of separation processes in which the support of the single-crystal SiC semi-finished product 700 to be processed is implemented via support of the cylinder lateral surface 730, the cylinder lateral surface 730 requires an exact alignment with respect to the orientation of the SiC lattice planes. In this separation method, the orientation of the lattice planes is thus transferred through their respective alignment with respect to the cylinder lateral surfaces 730.

FIG. 12 illustrates a configuration in which the monocrystalline SiC semi-finished product 700 is supported on one of the front faces 720*b*. In the case of separation processes in which the support of the single-crystal SiC semi-finished product to be processed is implemented via support of the front faces, the front faces require an exact alignment with respect to the orientation of the lattice planes. In these separation methods, the orientation of the SiC lattice planes is transferred through the alignment of one of the cylinder frontal faces 720*b* with respect to the lattice planes. In this case, the orientation of the lattice planes with respect to the frontal face 720*b* intended for the support is preferably measured using X-radiographic methods, set using a goniometer, and precisely transferred during the mechanical processing, for example using a grinding process. For a precise transfer of the predetermined orientation of the 4H—SiC lattice planes into the substrate wafers 740, one of the following basic conditions should be satisfied by the monocrystalline SiC semi-finished product 700:

at least one of both frontal faces 720*a* and/or 720*b* (reference surface) is oriented at a right angle with respect to the cylindrical lateral surface 730, i.e. the lattice orientation is precisely transferred through one of the reference surfaces;

both frontal faces 720*a* and 720*b* (reference surface) are oriented at a right angle with respect to the cylindrical lateral surface 730, i.e. the lattice orientation can be precisely transferred through both reference surfaces;

one of the frontal faces 720*a* or 720*b* (reference surface) is precisely oriented at a right angle with respect to the cylindrical lateral surface 730, and a second frontal face 720*b* or 720*a* is oriented in such a way that measurements in the direction [1$\bar{1}$00] exhibit a total thickness variation (TTV) between 40 µm and 340 µm of the second front face with respect to the first frontal face, i.e. the lattice orientation can be precisely transferred through both reference surfaces, where one frontal face is exactly oriented and the other frontal face within the intended orientation.

In conclusion, the present invention allows reducing the occurrence of fissures during mechanical processing of 4H—SiC single-crystals and/or 4H—SiC substrates by setting an optimal orientation of preferred cleavage planes with respect to lateral surfaces and/or one or both front faces of the SiC semi-finished product (or 4H—SiC substrate) such that the radial mechanical force applied on a given area is always distributed over at least a predetermined minimum number of the preferred cleavage planes, irrespectively from the position on the perimeter of the SiC semi-finished product where the mechanical force is being applied.

Consequently, via this optimal orientation of the 4H—SiC crystal structure, a higher mechanical robustness during mechanical processing of bulk SiC crystals and SiC substrates can be achieved, and therefore, a higher yield of the monocrystalline semi-finished and end products, without reducing the epitaxy qualities of the future substrates and without a significant increase in costs and/or time of the respective mechanical processes.

Although certain features of the above exemplary embodiments were described using terms such as "downwards" and "horizontal", these terms are used for the purpose of facilitating the description of the respective features and their relative orientation within the 4H—SiC single-crystals and/or 4H—SiC substrates only and should not be construed as limiting the claimed invention or any of its components to a particular spatial orientation. Moreover, although the present invention has been described above with reference to 4H—SiC crystals, the principles of the present invention can also be advantageously applied to SiC single-crystals of other modifications and/or to other semiconductor monocrystals, such as AlN and GaN.

REFERENCE SIGNS

C geometrical, longitudinal axis
L line segment
h height of a grinding wheel, length of line segment L
100 SiC semi-finished product
110 orientation flat (OF)
120*a*, 120*b* upper and lower front faces of cylinder
130 lateral cylindrical surface
200 SiC semi-finished product with on-axis orientation (prior art)
220 front face
230 cylindrical, lateral surface
240 grinding wheel
300 SiC substrate with 4°-off orientation (prior art)

320a, 320b upper and lower front faces of cylinder
330 cylindrical, lateral surface
400 SiC semi-finished product with 4°-off orientation (prior art)
420a, 420b upper and lower front faces of cylinder
430 cylindrical, lateral surface
500 SiC semi-finished product
520a, 520b upper and lower front faces of cylinder
530 cylindrical, lateral surface
600 SiC semi-finished product
620a, 620b upper and lower front faces of cylinder
630 cylindrical, lateral surface
700 mono-crystalline SiC semi-finished product
710 support
720a, 720b, and 730 frontal faces and lateral surface
740 substrate wafers

The invention claimed is:

1. A monocrystalline 4H—SiC semi-finished product of improved mechanical robustness against cleavage, the 4H—SiC semi-finished product having a longitudinal axis and a at least partially curved lateral surface parallel to said longitudinal axis,
characterized in that
the crystal structure of the 4H—SiC semi-finished product has a predetermined orientation with respect to the longitudinal axis such that at each position on the lateral surface of the semi-finished product there is a line segment which is intersected by at least a predetermined minimum number of 1000 parallel cleavage planes of the 55 10$\bar{1}$0} form per millimeter of line segment length irrespectively of a position of the line segment along an outer perimeter of the 4H—SiC semi-finished product,
wherein the number of parallel cleavage planes ($\bar{1}$100) intersecting the line segment is less than 10000 parallel cleavage planes per millimeter of the line segment length,
wherein said line segment is parallel to the longitudinal axis, and
wherein at said predetermined orientation:
a principal axis of the basal plane of the 4H—SiC crystal structure is tilted in the [$\bar{1}\bar{1}$20] direction by a first tilt angle in relation to the longitudinal axis; and/or
a principal axis of the basal plane of the 4H—SiC crystal structure is tilted in the [1$\bar{1}$00] direction by a second tilt angle in relation to the longitudinal axis, wherein said second tilt angle is estimated based on a distance between said parallel cleavage planes of the {10$\bar{1}$0} form such as to yield said at least predetermined minimum number of 1000 parallel cleavage planes of the {10$\bar{1}$0} form per millimeter of the line segment length, and/or
the second tilt angle is a value selected from the interval [0.015°; 0.153°].

2. The monocrystalline 4H—SiC semi-finished product of claim 1,
wherein
the form {10$\bar{1}$0} parallel cleavage planes includes the cleavage planes (10$\bar{1}$0), (1$\bar{1}$00), and (0$\bar{1}$10); and
said longitudinal axis is an axis of symmetry of a cylinder defined by a curved part of the at least partially curved lateral surface of the 4H—SiC semi-finished product.

3. The monocrystalline 4H—SiC semi-finished product of claim 1,
wherein
the first tilt angle is 4°, with a tolerance of ±0.5.

4. The monocrystalline 4H—SiC semi-finished product of claim 1, further comprising first and second front faces;
wherein one or both of the first and second front faces are perpendicular to the longitudinal axis; or
wherein the first front face is perpendicular to the longitudinal axis and the second front face is oriented in such a way that measurements along the [1$\bar{1}$00] direction yield a total thickness variation between 40 μm and 340 μm of said second front face with respect to the first front face.

5. The monocrystalline 4H—SiC semi-finished product of claim 1,
wherein:
said at least partially curved lateral surface has a curved part that defines a cylindrical surface with said longitudinal axis as its symmetry axis,
wherein said cylindrical surface has an outer diameter that substantially corresponds to a given diameter of substrate wafers obtainable by slicing the 4H—SiC semi-finished product, and/or
said cylindrical surface has an outer diameter of 150.0 mm±0.5 mm, 200.0 mm±0.5 mm, or 250.0 mm±0.5 mm; and/or
the monocrystalline 4H—SiC semi-finished product has a height larger than 15 mm, and/or
the monocrystalline 4H—SiC semi-finished product has a nitrogen doping larger than $1\times10^{18}$ cm$^{-3}$, and/or
the monocrystalline 4H—SiC semi-finished product has an orientation flat with a length of 47.5 mm±1.0 mm or a notch.

6. A method of producing a monocrystalline 4H—SiC semi-finished product with improved mechanical robustness against cleavage, the monocrystalline 4H—SiC semi-finished product having a longitudinal axis and a at least partially curved lateral surface that is parallel to said longitudinal axis, the method comprising:
performing a process of setting a predetermined orientation of the 4H—SiC crystal structure with respect to said longitudinal axis such that at each position on the lateral surface of the 4H—SiC semi-finished product there is a line segment which is intersected by at least a predetermined minimum number of 1000 parallel cleavage planes of the 55 10$\bar{1}$0} form per millimeter of length, of said line segment, irrespectively of a position of the line segment along an outer perimeter of the 4H—SiC semi-finished product,
wherein the number of parallel cleavage planes (1$\bar{1}$00) intersecting the line segment is less than 10000 parallel cleavage planes per millimeter of the line segment length;
wherein said line segment is parallel to the longitudinal axis; and
the method further comprising:
estimating said predetermined orientation such as to yield the at least predetermined minimum number of 1000 parallel cleavage planes of the {10$\bar{1}$0} form per millimeter of length, of said line segment.

7. The method of claim 6, wherein
the form 55 10$\bar{1}$0} parallel cleavage planes comprises the (10$\bar{1}$0), (1$\bar{1}$00), and (0$\bar{1}$10) cleavage planes.

8. The method of claim 6, wherein the process of setting said predetermined orientation of the 4H—SiC crystal structure with respect to said longitudinal axis of the 4H—SiC semi-finished product includes:
spatially orienting a 4H—SiC monocrystal with respect to an alignment axis such that the orientation of the 4H—SiC crystal structure is set to a predetermined tilting, in direction and amount, of the [0001]-axis of the basal plane in the 4H—SiC crystal structure in relation to said alignment axis; and machining an external surface of the spatially oriented 4H—SiC monocrystal with reference to said alignment axis to form at least one of:
- a at least partially curved lateral surface that is substantially parallel to said alignment axis, and
- at least one front face surface that is substantially orthogonal to said alignment axis;

wherein the longitudinal axis of the 4H—SiC semi-finished product corresponds to the alignment axis of the spatially oriented 4H—SiC monocrystal.

9. The method of claim 8, wherein
the process of setting the predetermined orientation of the 4H—SiC crystal structure is performed on a raw 4H—SiC monocrystal and includes performing angle measurements of the 4H—SiC crystal structure to determine the orientation of the principal axis of the basal plane, and
wherein the 4H—SiC semi-finished product is obtained, after the process of setting is completed on the raw 4H—SiC monocrystal, by performing the following steps:
- machining at least one front face surface along said initial orientation, and
- machining the at least partially curved surface in a direction transverse to said initial direction.

10. The method of claim 6, wherein the process of setting said
predetermined orientation of the 4H—SiC crystal structure includes:
orienting the basal plane of the 4H—SiC crystal structure with an initial orientation;
tilting the basal plane from the initial orientation to a first orientation by a first tilt angle in the [$\bar{1}\bar{1}20$] direction of the 4H—SiC crystal structure; and
tilting the basal plane from the first orientation to a second orientation by a second tilt angle in either the 8 $1\bar{1}00$] direction or the [$\bar{1}100$] direction of the 4H—SiC crystal structure;
wherein in said initial orientation the basal plane is substantially perpendicular to the longitudinal axis of the final oriented 4H—SiC semi-finished product.

11. The method of claim 10, wherein
the first tilt angle is 4°, with a tolerance of ±0.5°; and/or
wherein said second tilt angle is estimated based on a distance between said parallel cleavage planes of the {$10\bar{1}0$} form such as to yield said at least predetermined minimum number of 1000 parallel cleavage planes of the {$10\bar{1}0$} form per millimeter of line segment length that intersect the line segment, and/or
the second tilt angle is a value selected from the interval [0.015°; 0.153°].

12. The method of claim 6, wherein the process of setting the
predetermined orientation of the 4H—SiC crystal structure includes:
orienting the basal plane of the 4H—SiC crystal structure with an initial orientation;
rotating the basal plane about said initial orientation by a predetermined rotation angle in a clockwise direction;
tilting the rotated basal plane by a third tilt angle in the [$\bar{1}\bar{1}20$] direction of the 4H—SiC crystal structure; and
wherein in said initial orientation the basal plane is substantially perpendicular to the longitudinal axis of the final oriented 4H—SiC semi-finished product.

13. The method of claim 12, wherein
the predetermined rotation angle is a value within the range [0.22°, 2.19°], and/or
the third tilt angle is 4°, with a tolerance of ±0.5°.

14. The method of claim 6, wherein the process of setting the
predetermined orientation of the 4H—SiC crystal structure includes:
orienting the basal plane of the 4H—SiC crystal structure with an initial orientation;
rotating the basal plane about said initial orientation by a predetermined rotation angle in a counter-clockwise direction;
tilting the rotated basal plane by a third tilt angle in the [$\bar{1}\bar{1}20$] direction of the 4H—SiC crystal structure; and
wherein in said initial orientation the basal plane is substantially perpendicular to the longitudinal axis of the final oriented 4H—SiC semi-finished product.

* * * * *